United States Patent
Renn et al.

(10) Patent No.: US 7,294,366 B2
(45) Date of Patent: Nov. 13, 2007

(54) LASER PROCESSING FOR HEAT-SENSITIVE MESOSCALE DEPOSITION

(75) Inventors: Michael J. Renn, Hudson, WI (US); Bruce H. King, Albuquerque, NM (US); Marcelino Essien, Cedar Crest, NM (US); Manampathy G. Giridharan, Mason, OH (US); Jyh-Cherng Sheu, Hsinchu (TW)

(73) Assignee: Optomec Design Company, Albuquerque, NM (US)

( * ) Notice: Subject to any disclaimer, the term of this patent is extended or adjusted under 35 U.S.C. 154(b) by 128 days.

(21) Appl. No.: 10/952,108

(22) Filed: Sep. 27, 2004

(65) Prior Publication Data

US 2005/0129383 A1 Jun. 16, 2005

Related U.S. Application Data

(60) Continuation-in-part of application No. 10/746,646, filed on Dec. 23, 2003, now abandoned, which is a continuation-in-part of application No. 09/844,666, filed on Apr. 27, 2001, now abandoned, which is a (Continued)

(60) Provisional application No. 60/508,759, filed on Oct. 3, 2003, provisional application No. 60/506,495, filed on Sep. 26, 2003, provisional application No. 60/102,418, filed on Sep. 30, 1998.

(51) Int. Cl.
*B05D 3/06* (2006.01)

(52) U.S. Cl. ............... 427/554; 427/226; 427/372.2; 427/596

(58) Field of Classification Search ............... None
See application file for complete search history.

(56) References Cited

U.S. PATENT DOCUMENTS 3,590,477 A  7/1971  Cheroff et al.

(Continued)

FOREIGN PATENT DOCUMENTS

| EP | 0 331 022 A2 | 9/1989 |
| EP | 0 444 550 A2 | 9/1991 |

OTHER PUBLICATIONS

*Webster's Ninth New Collegiate Dictionary*, Merriam-Webster, Inc., Springifled, MA. USA,(1990),744.
Ashkin, A , "Acceleration and Trapping of Particles by Radiation Pressure", *Physical Review Letters*, (Jan. 26, 1970),156-159.
Ashkin, A. , "Optical trapping and manipulation of single cells using infrared laser beams", *Nature*, (Dec. 1987),769-771.

(Continued)

*Primary Examiner*—William Phillip Fletcher, III
*Assistant Examiner*—Cachet I. Sellman
(74) *Attorney, Agent, or Firm*—Jeffrey D. Myers; Philip D. Askenazy; Peacock Myers, P.C.

(57) ABSTRACT

A method of depositing various materials onto heat-sensitive targets. Heat-sensitive targets are generally defined as targets that have thermal damage thresholds that are lower than the temperature required to process a deposited material. The invention uses precursor solutions and/or particle or colloidal suspensions, along with optional pre-deposition treatment and/or post-deposition treatment to lower the laser power required to drive the deposit to its final state. The present invention uses Maskless Mesoscale Material Deposition ($M^3D$™) to perform direct deposition of material onto the target in a precise, highly localized fashion. Features with linewidths as small as 4 microns may be deposited, with little or no material waste. A laser is preferably used to heat the material to process it to obtain the desired state, for example by chemical decomposition, sintering, polymerization, and the like. This laser processing may be performed in an ambient environment with laser powers of less than 100 milliwatts.

30 Claims, 9 Drawing Sheets

Related U.S. Application Data division of application No. 09/305,985, filed on May 5, 1999, now Pat. No. 6,251,488, said application No. 10/746,646 is a continuation-in-part of application No. 10/346,935, filed on Jan. 17, 2003, now Pat. No. 7,045,488, which is a continuation-in-part of application No. 09/574,955, filed on May 19, 2000, now Pat. No. 6,823,124, which is a continuation of application No. 09/408,621, filed on Sep. 30, 1999, now abandoned, said application No. 10/346,935 is a continuation-in-part of application No. 09/584,997, filed on Jun. 1, 2000, now Pat. No. 6,636,676, which is a continuation-in-part of application No. 09/408,621, said application No. 10/346,935 is a continuation-in-part of application No. 10/072,605, filed on Feb. 5, 2002, now Pat. No. 7,108,894, which is a continuation-in-part of application No. 10/060,960, filed on Jan. 30, 2002, now abandoned, which is a continuation-in-part of application No. 10/060,090, filed on Jan. 30, 2002, now abandoned.

U.S. PATENT DOCUMENTS

| Patent No. | | Date | Inventor(s) |
|---|---|---|---|
| 3,715,785 | A | 2/1973 | Brown et al. |
| 3,808,432 | A | 4/1974 | Ashkin |
| 3,808,550 | A | 4/1974 | Ashkin |
| 3,846,661 | A | 11/1974 | Brown et al. |
| 3,854,321 | A | 12/1974 | Dahneke |
| 3,901,798 | A | 8/1975 | Peterson |
| 3,959,798 | A | 5/1976 | Hochberg et al. |
| 3,974,769 | A | 8/1976 | Hochberg et al. |
| 3,982,251 | A | 9/1976 | Hochberg |
| 4,016,417 | A | 4/1977 | Benton |
| 4,019,188 | A | 4/1977 | Hochberg |
| 4,046,073 | A | 9/1977 | Mitchell et al. |
| 4,046,074 | A | 9/1977 | Hochberg et al. |
| 4,092,535 | A | 5/1978 | Ashkin et al. |
| 4,112,437 | A | 9/1978 | Mir et al. |
| 4,132,894 | A | 1/1979 | Yule |
| 4,171,096 | A | 10/1979 | Welsh et al. |
| 4,200,669 | A | 4/1980 | Schaefer et al. |
| 4,228,440 | A | 10/1980 | Horike et al. |
| 4,269,868 | A | 5/1981 | Livsey |
| 4,323,756 | A | 4/1982 | Brown et al. |
| 4,453,803 | A | 6/1984 | Hidaka et al. |
| 4,485,387 | A | 11/1984 | Drumheller |
| 4,497,692 | A | 2/1985 | Gelchinski et al. |
| 4,670,135 | A | 6/1987 | Marple et al. |
| 4,689,052 | A | 8/1987 | Ogren et al. |
| 4,825,299 | A | 4/1989 | Okada et al. |
| 4,826,583 | A | 5/1989 | Biernaux et al. |
| 4,893,886 | A | 1/1990 | Ashkin et al. |
| 4,904,621 | A | 2/1990 | Loewenstein et al. |
| 4,911,365 | A | 3/1990 | Thiel et al. |
| 4,947,463 | A * | 8/1990 | Matsuda et al. ....... 219/121.85 |
| 4,997,809 | A | 3/1991 | Gupta |
| 5,032,850 | A | 7/1991 | Andeen et al. |
| 5,043,548 | A | 8/1991 | Whitney et al. |
| 5,164,535 | A | 11/1992 | Leasure |
| 5,170,890 | A | 12/1992 | Wilson et al. |
| 5,182,430 | A | 1/1993 | Lagain |
| 5,194,297 | A | 3/1993 | Scheer et al. |
| 5,208,431 | A | 5/1993 | Uchiyama et al. |
| 5,254,832 | A | 10/1993 | Gartner et al. |
| 5,270,542 | A | 12/1993 | McMurry et al. |
| 5,292,418 | A | 3/1994 | Morita et al. |
| 5,322,221 | A | 6/1994 | Anderson |
| 5,335,000 | A | 8/1994 | Stevens |
| 5,366,559 | A | 11/1994 | Periasamy |
| 5,378,505 | A | 1/1995 | Kubota et al. |
| 5,378,508 | A | 1/1995 | Castro et al. |
| 5,403,617 | A | 4/1995 | Haaland |
| 5,449,536 | A * | 9/1995 | Funkhouser et al. ........ 427/597 |
| 5,486,676 | A | 1/1996 | Aleshin |
| 5,495,105 | A | 2/1996 | Nishimura et al. |
| 5,512,745 | A | 4/1996 | Finer et al. |
| 5,607,730 | A | 3/1997 | Ranalli |
| 5,612,099 | A * | 3/1997 | Thaler ........................ 427/565 |
| 5,614,252 | A | 3/1997 | McMillan et al. |
| 5,648,127 | A | 7/1997 | Turchan et al. |
| 5,733,609 | A | 3/1998 | Wang |
| 5,736,195 | A | 4/1998 | Haaland |
| 5,770,272 | A | 6/1998 | Biemann et al. |
| 5,772,106 | A | 6/1998 | Ayers et al. |
| 5,814,152 | A | 9/1998 | Thaler |
| 5,844,192 | A | 12/1998 | Wright et al. |
| 5,854,311 | A | 12/1998 | Richart |
| 5,940,099 | A | 8/1999 | Karlinski |
| 5,958,268 | A | 9/1999 | Engelsberg et al. |
| 5,965,212 | A | 10/1999 | Dobson et al. |
| 5,980,998 | A | 11/1999 | Sharma et al. |
| 5,993,549 | A | 11/1999 | Kindler et al. |
| 5,997,956 | A * | 12/1999 | Hunt et al. ................. 427/446 |
| 6,007,631 | A | 12/1999 | Prentice et al. |
| 6,015,083 | A | 1/2000 | Hayes et al. |
| 6,025,037 | A | 2/2000 | Wadman et al. |
| 6,110,144 | A | 8/2000 | Choh et al. |
| 6,116,718 | A | 9/2000 | Peeters et al. |
| 6,136,442 | A | 10/2000 | Wong |
| 6,151,435 | A | 11/2000 | Pilloff |
| 6,159,749 | A | 12/2000 | Liu |
| 6,182,688 | B1 | 2/2001 | Fabre |
| 6,251,488 | B1 | 6/2001 | Miller et al. |
| 6,258,733 | B1 | 7/2001 | Solayappan et al. |
| 6,265,050 | B1 | 7/2001 | Wong et al. |
| 6,290,342 | B1 | 9/2001 | Vo et al. |
| 6,291,088 | B1 | 9/2001 | Wong |
| 6,293,659 | B1 | 9/2001 | Floyd et al. |
| 6,340,216 | B1 | 1/2002 | Peeters et al. |
| 6,348,687 | B1 | 2/2002 | Brockmann et al. |
| 6,379,745 | B1 | 4/2002 | Kydd et al. |
| 6,406,137 | B1 | 6/2002 | Okazaki et al. |
| 6,416,156 | B1 | 7/2002 | Noolandi et al. |
| 6,416,157 | B1 | 7/2002 | Peeters et al. |
| 6,416,158 | B1 | 7/2002 | Floyd et al. |
| 6,416,159 | B1 | 7/2002 | Floyd et al. |
| 6,454,384 | B1 | 9/2002 | Peeters et al. |
| 6,467,862 | B1 | 10/2002 | Peeters et al. |
| 6,481,074 | B1 | 11/2002 | Karlinski |
| 6,503,831 | B2 | 1/2003 | Speakman |
| 6,521,297 | B2 | 2/2003 | McDougall et al. |
| 6,544,599 | B1 | 4/2003 | Brown et al. |
| 6,548,122 | B1 | 4/2003 | Sharma et al. |
| 6,573,491 | B1 | 6/2003 | Marchitto et al. |
| 6,636,676 | B1 | 10/2003 | Renn |
| 6,780,377 | B2 | 8/2004 | Hall et al. |
| 6,823,124 | B1 | 11/2004 | Renn et al. |
| 2002/0012743 | A1 | 1/2002 | Sampath et al. |
| 2002/0132051 | A1 | 9/2002 | Choy |
| 2002/0162974 | A1 | 11/2002 | Orsini et al. |
| 2003/0003241 | A1 | 1/2003 | Suzuki et al. |
| 2003/0048314 | A1 | 3/2003 | Renn |
| 2003/0175411 | A1 | 9/2003 | Kodas et al. |
| 2003/0219923 | A1 | 11/2003 | Nathan et al. |
| 2004/0179808 | A1 | 9/2004 | Renn |
| 2006/0008590 | A1 | 1/2006 | King et al. |

OTHER PUBLICATIONS

Dykhuizen, R. C., "Impact of High Velocity Cold Spray Particles", (May 13, 2000),1-18.

Lewandowski, H. J., et al., "Laser Guiding of Microscopic Particles in Hollow Optical Fibers", *Announcer 27, Summer Meeting—Invited and Contributed Abstracts*, (Jul. 1997),89.

Marple, V. A., et al., "Inertial, Gravitational, Centrifugal, and Thermal Collection Techniques", *Aerosol Measurement: Principles, Techniques and Applications*, (2001),229-260.

Odde, D. J., et al., "Laser-Based Guidance of Cells Through Hollow Optical Fibers", *The American Society for Cell Biology Thirty-Seventh Annual Meeting*, (Dec. 17, 1997).

Odde, D. J., et al., "Laser-guided direct writing for applications in biotechnology", *Trends in Biotechnology*, (Oct. 1999),385-389.

Renn, M. J., et al., "Evanescent-wave guiding of atoms in hollow optical fibers", *Physical Review A*, (Feb. 1996),R648-R651.

Renn, M. J., et al., "Laser-Guidance and Trapping of Mesoscale Particles in Hollow-Core Optical Fibers", *Physical Review Letters*, (Feb. 15, 1999),1574-1577.

Renn, M. J., et al., "Laser-Guided Atoms in Hollow-Core Optical Fibers", *Physical Review Letters*, (Oct. 30, 1995),3253-3256.

Renn, M. J., et al., "Optical-dipole-force fiber guiding and heating of atoms", *Physical Review A*, (May 1997),3684-3696.

Renn, M. J., et al., "Particle manipulation and surface patterning by laser guidance", *Journal of Vacuum Science & Technology B*, (Nov./Dec. 1998),3859-3863.

Renn, M. J., et al., "Particle Manipulation and Surface Patterning by Laser Guidance", *Submitted to EIPNB '98, Session AM4*, (1998).

Sobeck, et al., *Technical Digest: 1994 Solid-State Sensor and Actuator Workshop*, (1994),647.

TSI Incorporated, "How A Virtual Impactor Works", www.tsi.com.

Vanheusden, K. , et al., "Direct Printing of Interconnect Materials for Organic Electronics", *IMAPS ATW, Printing an Intelligent Future*, (Mar. 8-10, 2002),1-5.

Fernandez De La Mora, J. , et al., "Aerodynamic focusing of particles in a carrier gas", *J. Fluid Mech.*, vol. 195, printed in Great Britain,(1988),1-21.

King, Bruce , et al., "M3D TM Technology: Maskless Mesoscale TM Materials Deposition", *Optomec pamphlet*, (2001).

Miller, Doyle , et al., "Maskless Mesoscale Materials Deposition", *HDI*, vol. 4, No. 9,(Sep. 2001),1-3.

Rao, N. P., et al., "Aerodynamic Focusing of Particles in Viscous Jets", *J. Aerosol Sci.*, vol. 24, No. 7, Pergamon Press, Ltd., Great Britain,(1993),879-892.

Renn, Michael J., et al., "Flow- and Laser-Guided Direct Write of Electronic and Biological Components", *Direct-Write Technologies for Rapid Prototyping Applications*, Academic Press,(2002),475-492.

Zhang, Xuefeng , et al., "A Numerical Characterization of Particle Beam Collimation by an Aerodynamic Lens-Nozzle System: Part I. An Individual Lens or Nozzle", *Aerosol Science and Technology*, vol. 36, Taylor and Francis,(2002),617-631.

* cited by examiner

LASER PROCESSING FOR HEAT-SENSITIVE MESOSCALE DEPOSITION

CROSS-REFERENCE TO RELATED APPLICATIONS

This application claims the benefit of the filing of U.S. Provisional Patent Application Ser. No. 60/506,495, entitled "Laser Treatment Process for Low-Temperature Deposition", filed on Sep. 26, 2003 and U.S. Provisional Patent Application Ser. No. 60/508,759, entitled "Method for Fabricating Resistive Structures", filed on Oct. 3, 2003. This application is also a continuation-in-part application of U.S. patent application Ser. No. 10/746,646, entitled "Apparatuses, Methods, and Precision Spray Processes for Direct Write and Maskless Mesoscale Material Deposition", filed on Dec. 23, 2003 now abandoned, which is both a continuation-in-part application of U.S. patent application Ser. No. 09/844,666, entitled "Precision Spray Processes for Direct Write Electronic Components", filed on Apr. 27, 2001 now abandoned (which is a divisional application of U.S. patent application Ser. No. 09/305,985, entitled "Precision Spray Processes for Direct Write Electronic Components", filed May 5, 1999, now issued as U.S. Pat. No. 6,251,488), and is also a continuation-in-part application of U.S. patent application Ser. No. 10/346,935, entitled "Apparatuses and Method for Maskless Mesoscale Material Deposition", to Michael J. Renn et al., filed on Jan. 17, 2003 now U.S. Pat. No. 7,045,015, which is a continuation-in-part application of the following U.S. patent applications:

U.S. patent application Ser. No. 09/574,955, entitled "Laser-Guided Manipulation of Non-Atomic Particles", to Michael J. Renn, et al., filed on May 19, 2000 now U.S. Pat. No. 6,823,124, which was a continuation application of U.S. patent application Ser. No. 09/408,621, entitled "Laser-Guided Manipulation of Non-Atomic Particles", to Michael J. Renn, et al., filed on Sep. 30, 1999 now abandoned, which claimed the benefit of U.S. Provisional Patent Application Ser. No. 60/102,418, entitled "Direct-Writing of Materials by Laser Guidance", to Michael J. Renn, et al., filed on Sep. 30, 1998;

U.S. patent application Ser. No. 09/584,997, entitled "Particle Guidance System", to Michael J. Renn, filed on Jun. 1, 2000, now issued as U.S. Pat. No. 6,636,676, which was a continuation-in-part application of U.S. patent application Ser. No. 09/408,621 filed Sep. 30, 1999 now abandoned;

U.S. patent application Ser. No. 10/060,960, entitled "Direct Write™ System", to Michael J. Renn, filed on Jan. 30, 2002 now abandoned, which was a continuation-in-part application of U.S. patent application Ser. Nos. 09/408,621 and 09/584,997; and U.S. patent application Ser. No. 10/072,605, entitled "Direct Write™ System", to Michael J. Renn, filed on Feb. 5, 2002 now U.S. Pat. No. 7,108,894, which was a continuation-in-part application of U.S. patent application Ser. No. 10/060,090 filed Jan. 30, 2002 now abandoned.

The specifications and claims of all of the above references are hereby incorporated herein by reference.

BACKGROUND OF THE INVENTION

1. Field of the Invention (Technical Field)

The present invention relates generally to the field of maskless direct write deposition of materials, including but not limited to mesoscale electronic structures, using aerodynamic focusing of an aerosolized fluid or particle suspension onto heat-sensitive targets, wherein laser radiation is preferably used to process the deposit to its final state.

2. Background Art

Note that the following discussion refers to a number of publications and references. Discussion of such publications herein is given for more complete background of the scientific principles and is not to be construed as an admission that such publications are prior art for patentability determination purposes.

Various techniques can be used for deposition of electronic materials, however thick film and thin film processing are the two dominant methods used to pattern microelectronic circuits. Thick film and thin film processes for the deposition of electronic structures are well developed, but have limitations due to the high processing temperatures required, or due to the need for expensive masks and vacuum chambers. Thick film processes typically require processing temperatures ranging from approximately 500 to 1000° C. Thin film techniques use processing temperatures ranging from approximately 400 to 3000° C., depending on the type of process and the material deposited. Due to inherent high processing temperatures, thick film and thin film techniques are generally limited to deposition onto ceramic, glass, silicon, and other targets having a damage threshold temperature above approximately 400° C.

Recently, techniques requiring processing temperatures below 200° C. have been developed for deposition of electronic structures on inexpensive plastic targets. One such process for fabrication of transistors on plastic targets is disclosed in U.S. Pat. No. 5,817,550, which uses a pulsed laser processing technique to produce temperatures required for material processing. The laser pulse duration lasts for short periods, limiting the sustained temperature of the target to below 250° C. Another such process for fabricating transistors on plastic targets is disclosed in U.S. Pat. No. 6,642,085, which uses a pulsed laser processing technique similar to that described in U.S. Pat. No. 5,817,550, but is capable of limiting the sustained target temperature to below 120° C.

A thin film process used to form ceramic metallo-organic thin films is disclosed in U.S. Pat. No. 5,064,684. This process casts a liquid metallo-organic ceramic precursor solution to form a layer on a target. The deposit is heated to a low temperature to create an amorphous layer. The process then heats a selected area to a high temperature using localized heating, creating a patterned area of polycrystalline ceramic having electro-optic properties. In U.S. Pat. No. 6,036,889, Kydd uses a mixture of metal powders and metallo-organic decomposition compounds in an organic liquid vehicle to form thick films. The compound is applied to a target using a deposition process such as silk screening, in which bonding is complete at temperatures of less than 450° C.

In U.S. Pat. No. 6,379,745, Kydd, et al. teach a composition having a metal powder or powders of specified characteristics in a Reactive Organic Medium (ROM) that can be deposited to produce patterns of electrical conductors on temperature-sensitive electronic targets. The patterns can be thermally cured in seconds to form pure metal conductors at a temperature low enough to avoid target damage.

In contrast with conventional methods for deposition of electronic materials, the M³D™ process, described in, for example, U.S. patent Publication Nos. 2003/0048314 and 2003/0228124, which are commonly owned with the present application, is a direct printing technique that does not require the use of vacuum chambers, masks, or extensive post-deposition processing. The M³D™ process may be used to deposit a variety of materials with little or no material waste, and has also been used to deposit materials which do not require high temperature processing on low temperature substrates. In order to facilitate this, various low temperature ink systems have been developed. These inks are typically either precursor-based, nanoparticle-based, or they can be combinations of the two. Metal-organic precursor chemistries have a specific advantage in that the precursors can decompose to pure metal at very low temperatures, 150-250° C. range. Because of this the inks can be deposited on many plastics and then heated to decompose to metal. The drawback is that the metal yield of precursor inks is typically low and is in the 1-10% range. The low yield reduces the overall deposition rates.

Metal nanoparticles also have drastically reduced treatment temperatures. Because of their high surface energy, nanoparticles will melt at temperatures hundreds of degrees lower than micron-sized particles. Nanoparticle inks in particular have been shown to sinter in the 150-250° C. range. The metal yield of nanoparticle inks can be in the 10-50% range, which leads to highly efficient deposition. For example, the M³D™ process has been used to deposit and laser process silver (at 150° C.) on an FR4 substrate, which has a damage threshold of less than 200° C., with no damage to the substrate.

While considerable progress has been made in low-temperature ink development, the sintering temperatures are still significantly higher than the softening temperature of many common plastics. For example PMMA softens at around 100° C. and most nanoparticle and precursor inks will not become conductive or ductile at this temperature. In addition, it is difficult if not impossible to avoid thermal damage to a target if the processing temperature of the deposited material exceeds the damage threshold of the target. The types of damage possible when polymer targets are subjected to excessive heat are warping, vaporization of volatile components, oxidation, decomposition, burning, softening, and melting. Glasses may undergo crystallization and melting, and metals may undergo oxidation, recrystallization, grain growth, reversed hardening, and melting, when subjected to excessive heat. Ceramics may also undergo thermal damage in the form of unfavorable phase changes that may lead to cracking or loss of material or electrical properties, vaporization of volatile components, and oxidation (for ceramics that are not oxides). For example, densification on low temperature substrates has only been achievable for materials that can be densified at temperatures below the damage threshold of the substrate.

Thus there is a need for an apparatus and method to deposit and process materials at a nearby or higher temperature than the damage threshold of the target or substrate.

SUMMARY OF THE INVENTION
(DISCLOSURE OF THE INVENTION)

The present invention is a method and apparatus for depositing a material on a target, comprising generating an aerosol stream, depositing the aerosol stream onto the target using an aerosol jet; processing the resulting deposit with a laser to obtain the material; wherein the processing temperature of the deposit is approximately at least as high as a damage threshold temperature of the target, and wherein an electrical property of the deposit is substantially similar to the electrical property of the material in bulk form. The electrical property preferably comprises resistivity and the target is optionally nonplanar. The damage threshold is preferably less than 200° C. The aerosol stream preferably comprises one or more materials selected from the groups consisting of liquid molecular chemical precursors and colloidal or particle suspensions. The aerosol stream preferably further comprises one or more materials generated from the groups comprising a metallo-organic precursor, a metallo-organic precursor; a colloidal metal solution; a metal paste; a metal nanoparticle suspension; a ceramic precursor; a ceramic paste; a resistor precursor solution; a resistor paste; an inorganic semiconductor suspension; a polymeric precursor solution; a colloidal suspension of metal, dielectric, or resistor particles; and any combination thereof. The aerosol stream preferably comprises droplets or particles having a diameter of less than approximately 10 microns.

The generating step preferably comprises using ultrasonic transduction or pneumatic aerosolization. The aerosol jet preferably comprises an annular flow, preferably an inner aerosol-laden flow surrounded by a sheath gas flow that confines the inner aerosol-laden flow. The annular flow preferably focuses the aerosol stream to mesoscale dimensions. The deposited feature size is preferably greater than or equal to approximately four microns. The feature size of the deposit after laser processing is preferably at least approximately one micron. The depositing step preferably comprises providing relative motion of the target and the aerosol stream. The method preferably further comprises the step of pre-processing the aerosol stream prior to the depositing step. The pre-processing step preferably comprises a process selected from the group consisting of humidifying the aerosol stream, drying the aerosol stream, cooling the aerosol stream, increasing the vapor content of a constituent of the aerosol stream, and increasing the vapor content of a second material that is not a constituent of the aerosol stream.

The method of the present invention preferably further comprises the step of post-processing the deposit prior to the processing step. The post-processing step preferably comprises an action selected from the group consisting of thermal heating, reducing the ambient pressure, irradiating with electromagnetic radiation, and combinations thereof. The deposit optionally comprises a width that is approximately equal to a diameter of a beam from the laser or is greater than a diameter of a beam from the laser. The deposition step and the processing step are preferably performed simultaneously. The processing step preferably comprises at least one process selected from the group consisting of chemical decomposition, polymerization, sintering, and melting. The target preferably comprises a material selected from the group consisting of polycarbonate, polyethylene terephthalate, polymethyl methacrylate, polytetrafluoroethylene, polyester, and various epoxies. The laser preferably comprises a diode laser. The laser power is preferably approximately 10 milliwatts. The laser preferably comprises a continuous wave mode or a pulsed wave mode. The energy of the pulsed wave mode is preferably several microjoules. The processing step preferably comprises delivering a laser beam to the target using either or both of a system of lenses and mirrors and an optical fiber. The laser beam is optionally delivered to the target apart from the aerosol stream, thereby resulting in serial process deposition and laser processing.

An object of the present invention is to provide a maskless non-contact process for deposition of a mesoscale structure onto a heat-sensitive target or substrate.

Another object of the present invention is to provide a process for depositing a mesoscale structure onto a heat-sensitive target using an aerosol jet to focus and deposit an aerosol stream in a pre-determined pattern.

It is further an object of the present invention to provide a laser processing treatment of a deposited material to achieve physical and/or electrical properties near that of a bulk material.

An advantage of the present invention is that it may be used to deposit materials including but not limited to conductors, semiconductors, insulators, and resistive and inductive structures.

Another advantage of the present invention is that low damage threshold target materials may be deposited on, including but not limited to plastics, ceramics, epoxies, and biological tissue.

A further advantage of the present invention is that the desired structure may be deposited onto a planar or non-planar target.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

Figure 1:
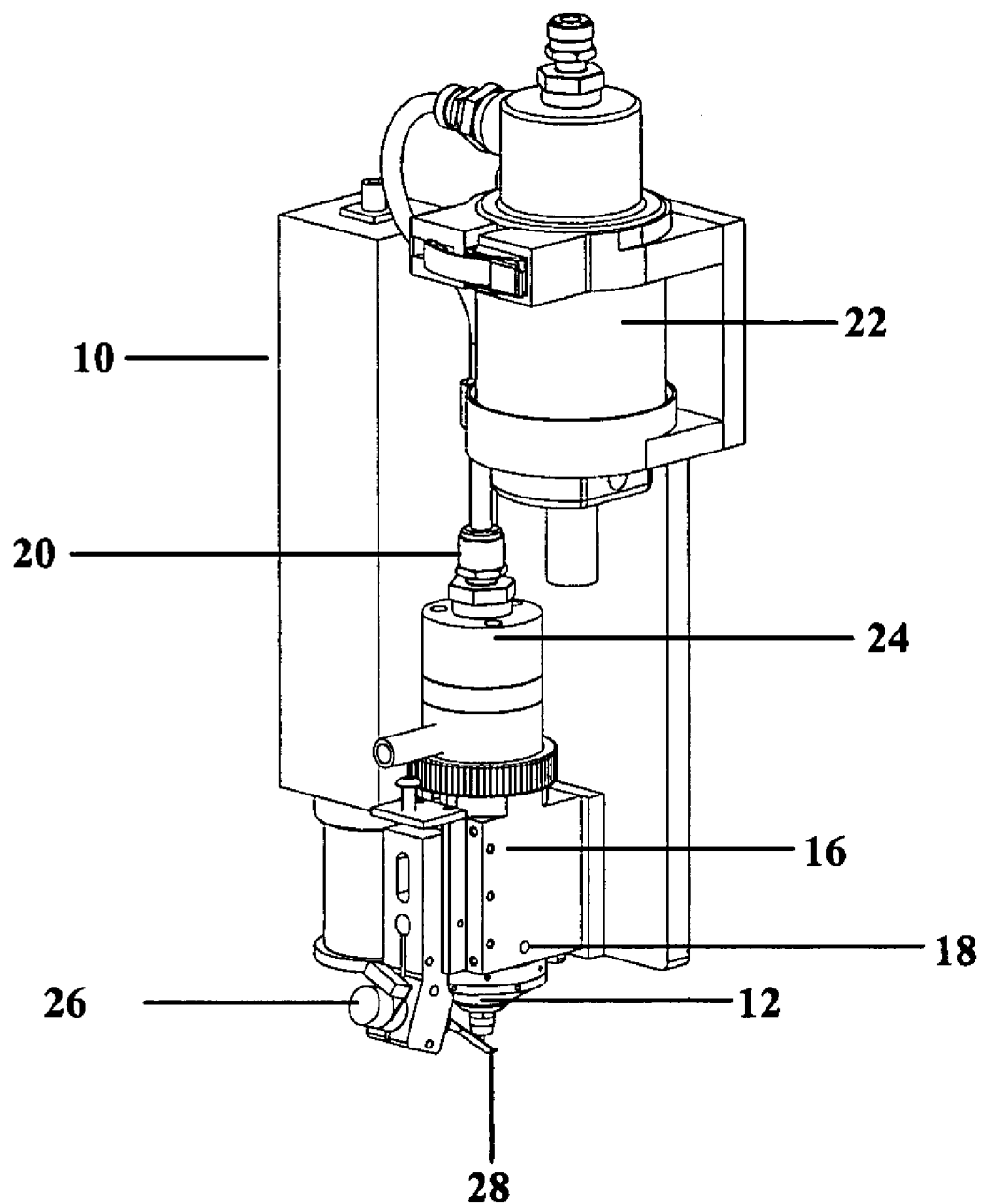
FIG. 1 is a drawing of the main components of the M³D™ system, shown with a pneumatic aerosolizer.

DESCRIPTION OF THE PREFERRED EMBODIMENTS (Best Modes for Carrying Out the Invention)

The present invention provides a method for maskless, non-contact direct printing of mesoscale structures of various materials onto heat-sensitive targets. Material deposition is preferably accomplished using the M³D™ aerosol-jetting device, which utilizes an aerosolized stream delivered to the target via an annularly flowing aerosol jet. The method preferably uses low-power laser radiation to heat the aerosol-jetted material to its final state. Combining the M³D™ process with laser processing extends the utilization of the technique to temperature sensitive applications, in which the temperature required to treat the deposited material approaches or exceeds the thermal damage threshold of the target. The process is capable of precise, selective deposition with little or no material waste. A positional accuracy of approximately 1 micron is achievable with laser processing and a subsequent material removal process, such as etching or rinsing, with a tool-to-target standoff distance of as much as approximately five millimeters.

As used throughout the specification and claims, heat-sensitive process means any process in which the temperature required to process the deposited material, i.e. drive it to its desired state, approaches or exceeds the damage threshold of the target, wherein the target is not globally heated above its damage threshold. Typically, such targets have a low damage threshold. A heat-sensitive process may have a wide range of temperatures.

Fundamental Description of Laser Processing on Heat-sensitive Materials

Laser processing of M³D™-deposited structures preferably combines highly localized aerodynamic deposition of material with a highly localized energy source providing the ability to focus laser radiation to a diameter that is approximately the same as the width of the deposited line, to engineer material formulations to be highly absorbing at the laser wavelength, to deposit nanoparticle suspensions, and to deliver laser energy in short pulses or by rapidly scanning over a deposit enables processing of various materials onto heat-sensitive targets with little or no damage to the target.

The present invention is capable of depositing materials at room temperature. Many of these materials can cure at room temperature. One advantage offered by the invention is the ability to lay down materials in patterns in the mesoscale range (from 1 to 1000 microns). If the material needs a thermal post treatment, the deposition can be followed with a laser treatment. The laser beam provides a highly localized thermal and photonic treatment of the material. The laser beam is capable of treating only the deposited material after deposition without affecting the underlying substrate.

Unlike some other previous deposition devices, the present invention allows for a variety of substrate treatments during the deposition process. Alternative embodiments of the invention include capabilities for heating the substrate by laser illumination or by increasing the ambient temperature. The substrate may also be cooled during deposition by reducing ambient temperature. Other alternative treatment steps may include photoactivation with a laser, irradiation with infrared light, or illumination with an arc lamp. Another substrate treatment comprises a washing or rinsing process.

Typical thick film techniques deposit materials that must be fired well above 400° C., limiting the process to high-temperature substrates. However, the present invention is capable of depositing materials onto heat-sensitive substrates, and then using thermal or laser processing to obtain the desired properties by virtue of the initial precursor chemistry or localized laser heating. Specifically, the present invention can deposit electronic materials onto low-cost polymer substrates that cannot withstand high-temperature oven fires.

Once the materials are deposited, they are optionally post-treated to produce desired electrical and mechanical properties. This can be done either thermally or by a laser processing step depending upon the deposition material and substrate combination being used.

The present invention comprises a maskless deposition process that fills a niche in the mesoscale regime between thick and thin film. The invention is capable of depositing multiple materials into fine geometries on both planar and curved substrates. The materials can be commercial pastes or custom, low-fire inks. Laser processing allows the materials to be densified on heat-sensitive polymers.

The present invention may be applied to a wide range of applications. The ability to deposit fine lines over curved and stepped surface suggests applications in writing interconnect wires between IC chips and PWB. The ability to deposit multiple materials lends to applications in multilayer components as well as to encapsulating components once they are built. The ability to fire materials on heat-sensitive substrate allows discrete components to be directly written on polymers. These features add up to a tremendous new capability and resource for electronics manufacturers.

Deposition Technique using the M³D™ Apparatus

The deposition technique used in the present invention is called Maskless Mesoscale Material Deposition (M³D™). The technique uses an annularly flowing aerosol jet to deposit features as small as approximately 4 microns. The jet consists of an inner aerosol-laden flow surrounded by a sheath gas flow that confines and focuses the inner flow. The two flows may also consist of fluids. Focusing of the aerosol stream to one-tenth of the exit orifice diameter has been demonstrated at distances of up to approximately five millimeters from the orifice. The orifice diameter preferably ranges from 100-500 microns.

While aerosolization can be accomplished using several methods, in the most general embodiment, the aerosol stream is preferably formed by aerosolizing a sample using an ultrasonic transducer and/or pneumatic nebulizer 22, as shown in FIG. 1. The aerosol stream is preferably comprised of a liquid molecular chemical precursor and/or colloidal or particle or nanoparticle suspension. These preferably further comprise a metallo-organic precursor; a colloidal metal solution; a metal paste; a ceramic precursor; a ceramic paste; a resistor precursor solution; a resistor paste; an inorganic semiconductor suspension; a polymeric precursor solution; a colloidal suspension of metal, dielectric, or resistor particles, or the like, or any combination thereof.

Virtually any material suitable for laser heating (i.e., will not be destroyed by the process) can be employed as a feedstock in the practice of the present invention, depending on the intended application. Without limiting the invention, dielectric materials such as barium titanate or silicon dioxide, resistive materials such as a ruthenates, metal dielectric composites such as silver+barium titanate, conductive materials such as silver, copper, or gold, semiconducting materials such as silicon, germanium, or gallium nitride, magnetic materials such as MnZn and FeZn, ceramics such as alumina or zirconium diboride, and cermets may all be deposited. The precursor solvent or suspending fluid used is preferably chosen based on its compatibility with the target material.

Figure 2:
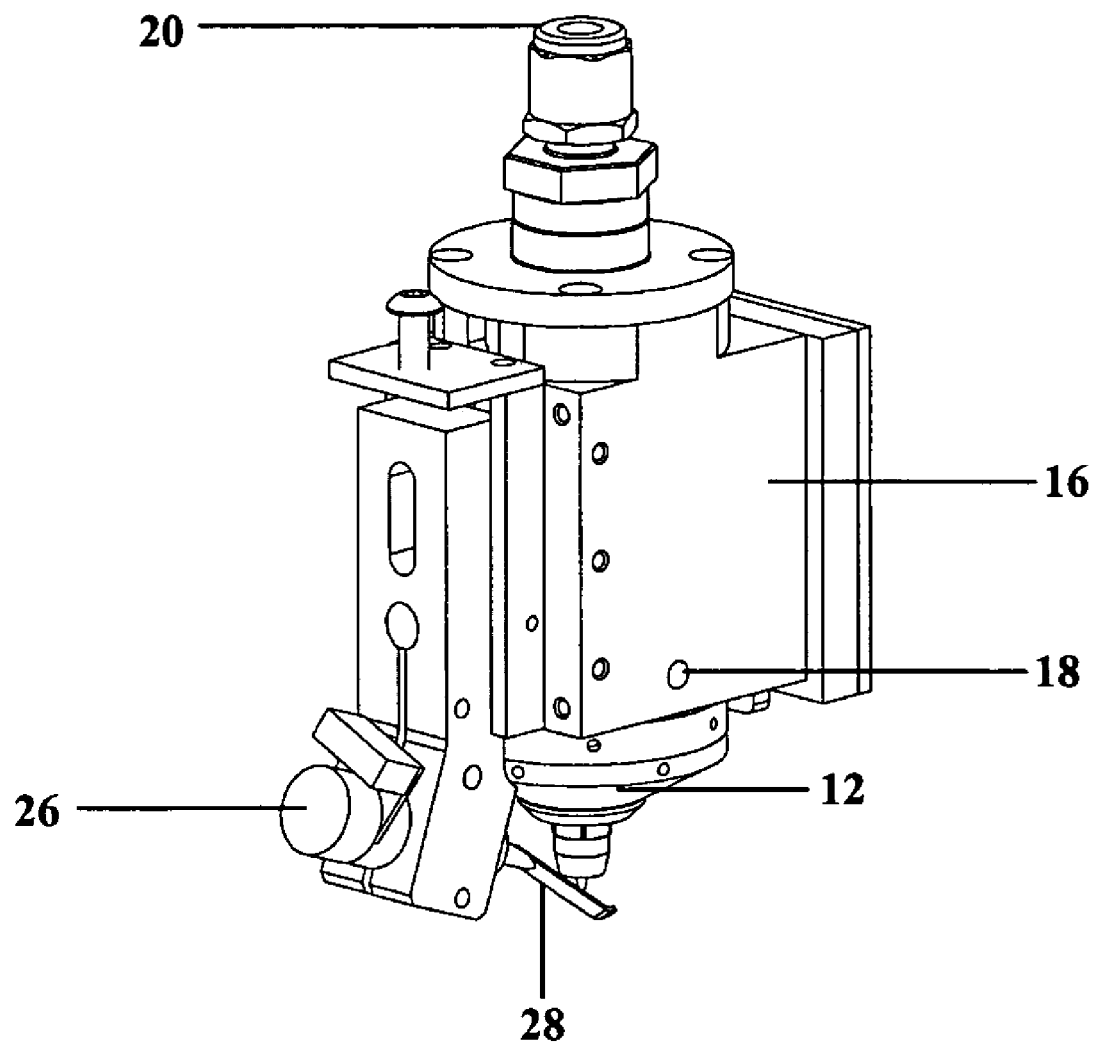
FIG. 2 is a drawing of the M³D™ deposition module.

The M³D™ apparatus preferably comprises an upper module for aerosolizing liquid chemical precursors or colloidal or particle suspensions, a deposition module for directing, focusing, and depositing the resulting aerosol, laser module 10 for delivering and focusing laser radiation, and a control module for monitoring and controlling the process parameters. The M³D™ deposition module, detailed in FIG. 2, preferably consists of virtual impactor 24, flowhead 12, and material shutter assembly 26 with mechanical shutter 28. When pneumatic atomization is used, the aerosol stream preferably is processed by virtual impactor 24, which reduces the volume of gas in which the aerosol is entrained. In the case of ultrasonic atomization, the aerosol-laden carrier gas preferably bypasses virtual impactor 24, and enters flowhead 12 immediately after the aerosolization process. The carrier gas preferably comprises either or both of a compressed air or an inert gas, and can comprise a solvent vapor. A flow controller preferably monitors and controls the mass throughput of the aerosolized stream.

The aerosolized stream preferably enters flowhead 12 via aerosol inlet 20 in heater assembly 16 mounted on the apparatus, and is preferably collimated as it flows through an orifice centered on the longitudinal axis of flowhead 12. Heater assembly 16 is preferably used to heat the aerosolized material to remove solvent or to modify the viscosity of the sample. The aerosol stream emerges with droplets and/or particles and is preferably entrained and surrounded by a sheath gas. The sheath gas comprises either or both of a compressed air or an inert gas, and can optionally comprise solvent vapor content or a fluid. The sheath gas enters through sheath air inlet 18, preferably located on heater assembly 16 below the aerosol inlet 20, and then enters the lower portion of flowhead 12, preferably through multiple internal ports, forming an annular flow surrounding the aerosol stream. The two streams exit the chamber through a second orifice directed at the target. The sheath gas forms a boundary layer that prevents particles from depositing onto the orifice wall. The annular flow exits flowhead 12 through a nozzle directed at the target. This annular configuration is capable of focusing the aerosol stream to approximately one-fifth to one-tenth the size of the orifice diameter, enabling deposition of features on the target with dimensions as small as approximately 4 microns.

The standoff distance between the system's flowhead and the target is typically 3 to 5 mm, enabling deposition onto non-planar surfaces. Patterns are preferably written by translating a computer-controlled target platen, located under stationary flowhead 12, using a CAD-based Virtual Masking™ (VMTool™) software application. Alternatively, flowhead 12 may be translated under computer control while maintaining the target in a fixed position, or both flowhead 12 and the target may be moved simultaneously. Software, such as VMTool™, preferably defines a toolpath for printing the desired circuit or element.

Material Processing Method

In the preferred embodiment of the present invention, the deposited material is processed with at least one laser. According to the present invention, deposited material may be processed at a higher temperature than the damage threshold of the target to drive the deposit to the desired state in order achieve physical, optical, or electrical properties near that of the bulk material, preferably with little or no physical, chemical, optical changes, or other damage to the underlying target. The processing may comprise chemical decomposition, polymerization, sintering, melting, or the like. Target materials may comprise any material with a low damage threshold temperature, including but are not limited to polymers, glasses, metals, various epoxies, and ceramics, more specifically such materials as polycarbonate, polyethylene terephthalate (PET), polymethyl methacrylate (PMMA), polytetrafluoroethylene (Teflon®), and polyester.

In the practice of the present invention, by using the proper laser parameters the target may be locally heated above its damage threshold without impact its global properties. Further, in many cases this local heating improves adhesion of the deposited material to the target. Unlike existing methods, the present invention provides for processing a deposit at temperatures of up to approx. 50° C. or more higher than the damage threshold of the target. With the laser treatment of the present invention, sintering inks on low-melting-temperature plastics is possible. The size of the deposit is in the mesoscale range, and can vary from several microns to approximately 1 millimeter, bridging the gap between thin film and thick film processes.

In order to lower the laser power required to process the deposited material to the desired state, thereby decreasing thermal damage to the target, the aerosol stream may optionally be pre-processed prior to deposition, most commonly before introduction of the aerosol into the flowhead. The pre-processing step may comprise processes including but not limited to increasing the solvent or suspending medium vapor content, partially decomposing, humidifying, drying, heating, or cooling of the aerosol, carrier gas, and/or sheath gas. The target is optionally conditioned by heating before deposition, preferably via a heater, infrared lamp, or high power diode laser. The deposited pattern may also optionally be post-processed prior to the laser treatment. Post-processing optionally comprises thermally heating the deposit in an ambient or reduced pressure environment, irradiating the deposit with electromagnetic radiation, or a combination thereof. These optional steps processing are preferably performed to remove solvent or other residual volatile constituents of the precursor solvent or the particle suspending fluid. When drying is required, it is preferably performed in a manner such that the deposit retains some of its fluid properties, so that wetting and coalescence of the aerosol droplets into a continuous structure is accomplished. In this manner, the amount of laser energy required for heating and vaporization of the solvent is reduced. Alternatively, deposition and processing of the aerosol stream may optionally be performed simultaneously.

The type of processing laser used may vary, and is dependent on the optical and thermal properties of the deposit and the target. The laser power may be as small as approximately 10 milliwatts, enabling the use of an inexpensive diode laser. The laser may comprise a continuous wave mode or a pulsed wave mode. The pulsed wave mode optionally comprises an energy as low as several microjoules. The laser beam is preferably delivered to the target using a series of mirrors and lenses that collimate and route the beam to a focusing lens. The beam may optionally be delivered using fiber optics, wherein the laser beam is launched into an appropriate optical fiber and delivered through the fiber to the focusing lens. The laser radiation is preferably to a spot size of less than one micron. Modification of the laser beam profile facilitates material processing on heat-sensitive targets. The laser beam is preferably expanded and collimated before being truncated and focused onto the target. The expansion of the beam is performed to decrease the focused spot size, and to aid in truncation. Truncation of the beam minimizes the inherent Gaussian variation in laser power across the beam profile. The truncation step allows for more uniform heating of the deposited line in the direction perpendicular to the target motion, and aids in the reduction of target damage at the boundaries of the deposit.

The wavelength of the laser is preferably chosen so that laser radiation is absorbed by the deposit but not by the target. That is, ideally the deposit is highly absorptive and the target is highly transmissive, that is, transparent or nearly transparent, at the wavelength of the laser. In this embodiment, the material may be sintered, decomposed, or otherwise processed, and most of the heat delivered to the target is the heat conducted through the deposit/target interface. In another embodiment, the target material is highly absorbing at the laser wavelength, and the deposit is weakly absorbing. In this case, the deposit is heated through conduction of thermal energy from the target/deposit boundary. The former case is ideal for laser processing of heat-sensitive targets. In normal applications, absorption of the laser radiation by both the target and the deposit occurs.

The laser may optionally be delivered to the target via the flowhead. The laser energy may alternatively be delivered to the target at a location that is different from the location of the flowhead, so that a serial process is used for deposition and laser processing. In an alternate embodiment, deposition and laser processing are performed simultaneously in order to deposit structures with a thickness greater than several microns, or in order to build three-dimensional structures with heights ranging from several microns to several millimeters. Simultaneous deposition and laser processing may also be used to form vias between target layers. In the case of simultaneous deposition and laser processing, the laser is preferably directed along the flowhead axis, emerges from the flowhead orifice, and heats the aerosol during flight and after deposition onto the target.

In an alternative embodiment, the laser radiation can optionally be delivered parallel to the target surface, so that in-flight processing of the aerosol is enabled without the laser heating the target. The aerosol particles can be rendered partially or wholly depositable, or optionally melted, in flight by exposure to a laser of sufficient intensity for a sufficient period of time. Exposure time may be increased by slowing feedstock velocity and/or increasing the area of laser through which the feedstock passes. In some instances it may be desirable to use a plurality of laser beams having a common area of intersection. Sufficient energy is preferably imparted to the feedstock in-flight to render the feedstock depositable and promote adhesion to the substrate without causing significant interfacial damage of the substrate or deposited feedstock, that is, while only providing sufficient peripheral heating of the substrate to facilitate adhesion without a significant level of surface modification. This embodiment preferably reduces or eliminates the need to create a molten puddle on the target surface. This broadens the range of materials that can be used as deposition substrates. Melting the particles prior to deposition according to this embodiment reduces residual stress contained within the fabricated structures, enabling a broader range of materials to be deposited onto dissimilar materials. In addition, the impacting characteristics of the depositable particle will behave similarly to thermal spray processes in which shrinkage of the substrate surface is counteracted by outward force due to the particle droplet spreading on impact.

The deposited pattern or structure preferably comprises a desired width that is approximately the same as the diameter of the laser beam so that direct irradiation of the target is limited or completely eliminated. In this case, if more material than the desired width has been deposited, after laser processing excess unprocessed deposit material can be removed by a process such as etching or rinsing. The desired width of the deposit may alternatively be greater than the diameter of the laser beam. For example, the present invention may be used to deposit a film of material with dimensions greater than the diameter of the laser beam. In this case, the laser beam is rastered, or scanned back and forth, over the desired area of the deposit to pattern a specific structure, and the unprocessed material is removed from the target. In either case, some shrinking of the deposit may occur, for example during the processes of chemical decomposition or sintering. However, the final dimensions of the deposit are mostly determined by the deposition mass flux, the target speed, and the fluid properties of the deposited material.

M³D™ APPLICATION EXAMPLES

Example 1

Laser Processing of Molecular Chemical Precursors

In the case of liquid precursor-based materials, laser treatment is used to raise the temperature of the deposit to its decomposition or curing temperature. In this process, a chemical decomposition or cross-linking takes place due to the input of laser energy, such that the precursor changes its molecular state. The change in molecular state results in the conversion of the precursor material to the desired material. Typically, the decomposition process also entails emission of gaseous by-products. Laser processing of precursor deposits on various targets is possible without incurring damage to the target.

Example 2

Laser Sintering of Particle Suspensions and Commercial Pastes and Inks

Laser sintering of particle suspensions on heat-sensitive targets is also possible with the present invention. In the sintering process, a solid, bonded mass is created without melting individual particles. The M³D™ process is capable of selective sintering of a two-component paste consisting of low and high-melting temperature particles such as low-melting point glass and metal, dielectric, resistive, or ferromagnetic materials.

Laser processing may be used to sinter commercial resistor and conductor pastes, and may also be used to sinter pastes for other electronic materials such as dielectrics and ferromagnetics. In the M³D™ deposition process, commercial pastes—which typically have viscosities of 100,000 centipoise or greater—are preferably diluted in a suitable solvent and pneumatically aerosolized for deposition. Laser sintering of M³D™-deposited commercial inks can also be accomplished on plastic and other heat-sensitive targets with damage thresholds of approximately 100° C. The commercial inks that may be processed using the M³D™ method and laser sintering typically consist of suspensions with particle diameters ranging from hundreds of nanometers to several microns. The inks may include, but are not limited to, conductive, resistive, and dielectrics formulations.

Example 3

Laser Sintering of M³D™-Deposited Nanoparticle Inks

Laser sintering of M³D™-deposited nanoparticle inks has also been used to form metal lines on heat-sensitive targets. The laser-sintered nanoparticle deposits preferably exhibit resistivities near that of the bulk metal. Laser sintering of M³D™-deposited nanoparticles to near bulk resistivities can be accomplished with 100 mW or less of visible or ultraviolet laser radiation. Infrared laser radiation may also be used for laser sintering of nanoparticles, given that the absorption of the ink is tailored to the wavelength of the laser.

The nanoparticle ink is preferably deposited in a fluid form, so that particle suspension is maintained, and the laser is then preferably scanned over the deposit to sinter individual particles. Simultaneous deposition and sintering of the nanoparticle ink may be performed to deposit lines with greater thickness than lines deposited using a serial deposition and decomposition process. Simultaneous deposition and sintering of the nanoparticle ink can also be used to form three-dimensional microstructures on heat-sensitive targets.

Example 4

TFT Fabrication on Plastics and Glass

In one embodiment, the present invention has been used to fabricate thin film transistors on plastic targets, with damage thresholds of approximately 100 to 150° C. Specifically, the invention can be used for solution-based fabrication of organic thin film transistors (OTFT's) on flexible targets such as PET (polyethylene terephthalate), PEN, polycarbonate, polyetheretherketone (PEEK), and polyester. The application of the M³D™ process to fabricate OTFT's can also be extended to glass targets. The process can deposit and process the organic semiconductor as well as the metallization required for OTFT fabrication. The present invention can also be used to deposit the source and drain electrodes, the gate electrode, and the gate insulator. Channel lengths as small as approximately 4 microns can be formed. The ratio of the channel width to channel length is preferably held to 10 or greater, to reduce the occurrence of fringe effects. Other configurations include an indium-tin oxide (ITO) gate and a polyimide insulation layer. Metals that can be deposited for OTFT electrode fabrication with near bulk resistivities include but are not limited to palladium, gold, and alloys thereof. In each case, the conductor or semiconductor material is deposited using the M³D™ flowhead and then processed to the desired state using laser treatment or thermal heating. The invention can be used to perform solution-based deposition of an organic semiconducting material, such as a pentacene precursor, which can be processed to form the semiconducting medium of the transistor.

Furthermore, the M³D™ process can be used to fabricate both the OTFT backplanes and the required electrical interconnects for glass and plastic displays. One common technique for fabrication of interconnects on plastics uses conductive polymers, which have resistivities as high as at least several thousand times that of bulk metal. The M³D™ process contrastingly is capable of depositing on plastic targets five to ten-micron wide silver interconnect lines having resistivities approximating that of the bulk metal.

The present invention can also be used to fabricate inorganic thin film transistors on various targets using an amorphous silicon ink and laser post-deposition processing.

Example 5

Flat Panel Display Repair

The present invention can be used to repair defects in glass and plastic flat panel display (FPD) circuitry. During FPD fabrication, shipping, or handling, electrical opens may occur on metal structures that form interconnect lines, bus lines, or any conductive pathway that routes signals to the display circuitry. Using the M³D™ process, gaps in conductive traces may be repaired by depositing a metal precursor, a metal nanoparticle ink, or the like, or a combination thereof, forming an electrical interconnect between the open circuit. The deposited material is then decomposed or sintered to its final state using a local or global heating process that can include, but is not limited to, irradiation of the deposit with laser radiation, irradiation with divergent or focused non-laser radiation, or heating the deposit in a furnace. The technique of repairing metal structures in FPD circuitry is significantly different from depositing metal structures on blank targets. Specifically, in the FPD repair application, care must be taken to deposit and process the material so that insufficient material deposition, cracking, or poor adhesion does not occur at the junction of the deposited structure and the end of the pre-existing line. Insufficient material deposition may occur if the viscosity of the deposited material is too low, so that material flows onto the target, and does not deposit to a sufficient height at the defect site. Cracking and poor adhesion may occur if excess material is applied to the defect site, particularly at the junction of the newly deposited structure and the end of the open line. However, the M³D™ processing parameters may be adjusted to deposit the correct thickness of material to allow for material deposition and processing without cracking or poor adhesion.

Processing of material in the form of precursor inks, nanoparticle deposits, or combinations of the two, with good adhesion to glass and plastic targets, can be accomplished with less than approximately 100 mW of laser power. Inexpensive diode laser systems can therefore be used to process materials for FPD repair on glass or plastic. The deposited material may include, but is not limited to, silver, gold, copper, and indium-tin oxide, with linewidths as small as approximately 5 microns.

Example 6

Flex Circuit Fabrication

Figure 3:
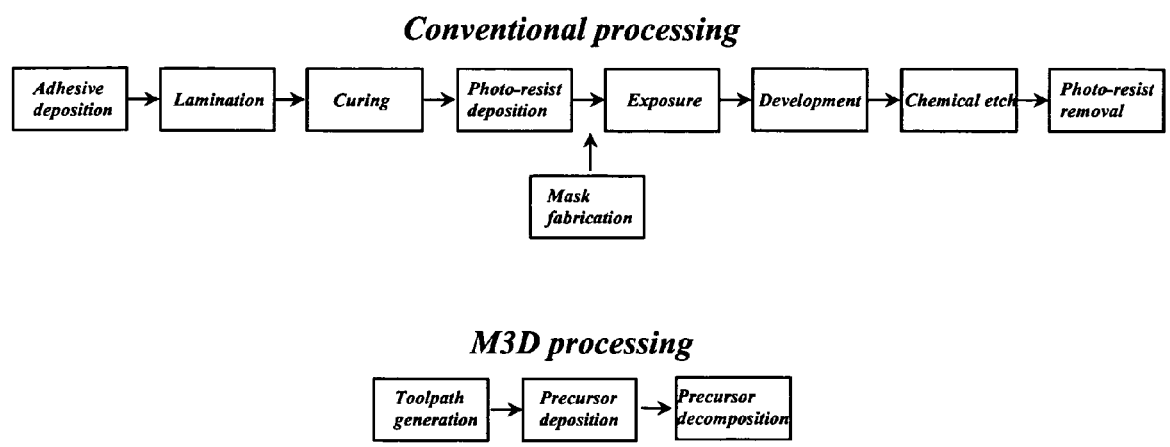
FIG. 3 is a flowchart showing the steps used in conventional flex circuit fabrication and those used in the M³D™ process for the same application.

The miniaturization and mobilization of many electronic devices has led to an increased transition from circuits printed on rigid targets to those printed on flexible targets. Flexible targets can be used for three-dimensional packaging and may considerably reduce the size and weight of a given device. Flex circuits also enable the production of a more robust device, since the magnitude of the vibrations and shocks that may damage rigid targets have a far lesser effect on circuits printed on flexible targets. This reduction in size and increase in robustness afforded by flex circuitry allows for the production of portable consumer and medical devices such as cameras, camcorders, cell phone, computers, hearing aids, pacemakers, and ambulance and operating room display equipment. Presently, the most common method for fabrication of flex circuits entails a multi-step photolithographic process, and includes lamination of a metal foil to the target, deposition of a resist, exposure of the resist through a mask, development, etching, and resist removal. These processes are time-consuming, and fabrication of the mask can be expensive. The process also generates waste, since only part of the original metal film is used in the circuit. The M³D™ process, on the other hand, proposes the use of a maskless, one-step deposition process for fabrication of flex circuitry. The present invention is a direct, additive process, and therefore eliminates the need for lamination, photo processing, chemical etching, and the associated material waste. The entire metallization process preferably requires only three steps, and is outlined in FIG. 3, along with the steps for the more conventional photolithographic process.

The application of the M³D™ process to the fabrication of flex circuits can also reduce the processing time and expense for the manufacture of multilayer circuits. In developing the M³D™ technology, the present inventors have developed a Virtual Masking™ tool (VMTool™), a CAD-based software program that enables computer-controlled patterning of an aerosolized liquid or suspension of particles. Using the M³D™ process and VMTool™, it is possible to pattern the insulator between flex circuit layers. This would eliminate the need for deposition of an adhesive and subsequent lamination onto the previous circuit layer.

Furthermore, hole punching or drilling needed in typical flex circuit fabrication would be reduced, or, in some cases, eliminated, since VMTool™ can deposit the patterned insulating layer required between three-dimensional circuit layers.

Example 7

Deposition of Gold and Platinum

The M³D™ apparatus can be used to deposit liquid molecular precursors for gold and platinum onto various targets. The precursor is preferably a metallo-organic system composed of a metal salt dissolved in an organic solvent. The approach aerosolizes the precursor and heats the droplets in flight before depositing the aerosol onto the target. The precursor method can be used for direct write of gold or platinum traces with linewidths as small as from approximately one micron to five microns, for targets with damage thresholds greater than approximately 400° C.

Nanoparticle-based gold inks offer an alternate to the precursor deposition method for depositing gold onto plastic targets. Gold precursor inks typically have decomposition temperatures that are several hundred degrees above the damage threshold temperature of plastics such as PET, PEEK, and PEN, precluding precursor deposition of gold. Nanoparticle gold inks, consisting of nanometer-size gold particles preferably with diameters ranging from 1 to 20 nanometers, can significantly lower the sintering temperature, and allow for laser processing of M³D™-deposited gold traces on low-temperature plastics having damage threshold temperatures as low as about 100° C. In general, the use of nanoparticle-based metal inks can lower the metal sintering temperature so that the present invention can be used for direct write metallization of plastic targets.

Example 8

Multi-Layer Inductor

The M³D™ process may also be used to produce multi-layered structures including but not limited to inductors and capacitors. In addition, because of the relatively large working distance of the M³D™ apparatus from the target (as much as 5 mm or more), the M³Dυ process may be used to deposit material onto non-planar surfaces with height variations on the order of hundreds of microns. As an example, the M³D™ process, followed by laser treatment, has been used to fabricate functional three-layer electrical components on low temperature targets.

A three-step process has been used to fabricate a ferrite-core inductor on a Kapton™ or alumina target. Step one was to deposit parallel lines of silver ink directly onto the target. The lines were approximately 100 microns wide, 1 micron thick and 1000 microns in length. The lines were laser treated to form dense, conductive silver wires. These wires comprise one portion of the conductive traces that will eventually wrap around a ferrite core. Silver contact pads (1000 micron square) were also added in the first layer. The second step was to deposit a mixture of manganese-zinc ferrite powder and low melting temperature glass over the conductive lines. The powder was densified by scanning a laser across the deposit, which melted the glass. The glass flowed around the ferrite particles, forming a dense matrix material after cooling. The ferrite deposition step was repeated several times to buildup the deposit to about 100 microns. The ferrite line lengths were about 1500 mm long. The final step was to deposit conductive diagonal silver lines over the ferrite core, connecting to the underlying parallel silver lines, to create the coil. Since the deposition head standoff distance is several millimeters, it is relatively simple to write over a millimeter-sized curved surface. The resistance of a typical coil generated using this method was on the order of several ohms. The inductance was 7 micro henries and the Q value was 4.2@1 MHz.

Figure 4:
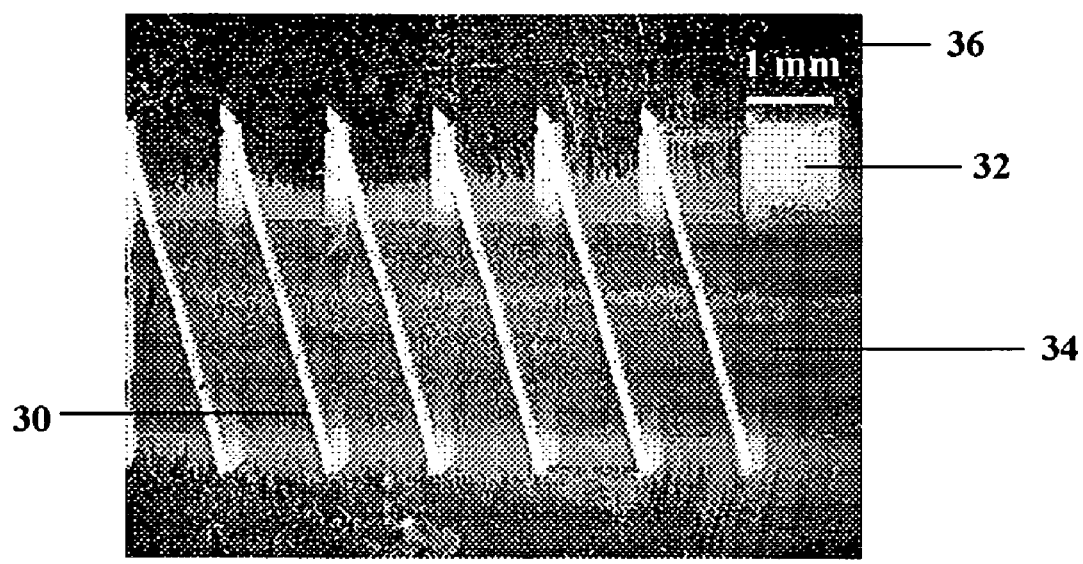
FIG. 4 is a micrograph of an inductor fabricated using the M³D™ process.
Figure 5:
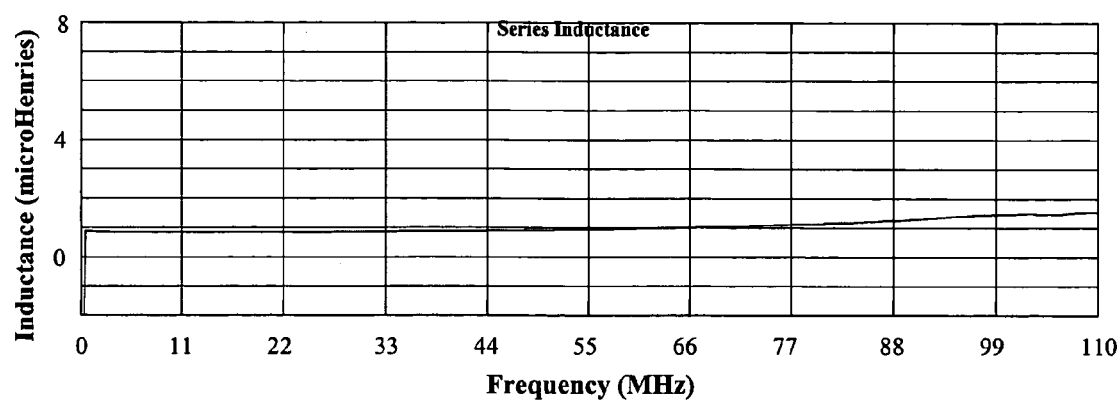
FIG. 5 shows an inductance curve.
Figure 5:
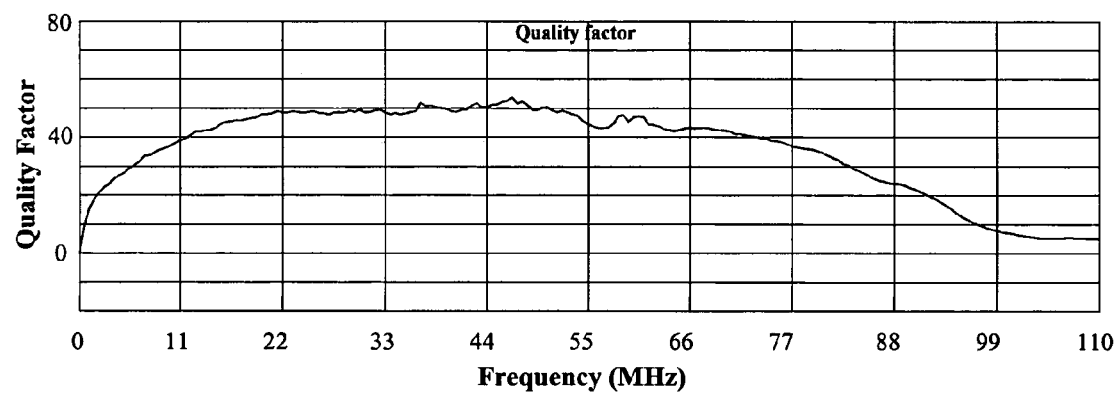

FIG. 4 shows a micrograph of an inductor fabricated using the M³D™ process on Kapton target 36. The first layer of silver lines requires a thickness (at least 10 microns) sufficient to prevent shorting due to electromigration of silver to the ferrite/glass layer during laser sintering of the core. The top layer of diagonal silver lines is typically written over a 100-500 micron nonconformal surface (in this case, ferrite core 34) to connect the bottom silver lines, forming inductor coil 30. The bottom electrode lines of layer one are fully dense traces with heights of approximately 50 microns. Contact pad 32 is 1 mm square. Ferrite core 34 is a 5×15 mm rectangle with a maximum height of 400 microns, and is preferably formed from a manganese/zinc iron oxide and glass powder. The inductance curve of an M³D™-fabricated inductor printed on Kapton is shown in FIG. 5, and reveals a gradual and predictable increase from 0.8 to 1.5 micro-Henrys in the range from 40 Hz to 110 MHz. The quality factor or energy stored per cycle was 50 at 50 MHz.

Example 9

Miniature Thermocouple

The M³D™ process has also been used to fabricate type-S (platinum, platinum/rhodium) thermocouples on tantalum nitride (TaN) targets. The platinum side of the device was written on the left arm of the thermocouple. The targeted alloying ratio of the platinum/rhodium arm was 90% Pt and 10% Rh. The devices were electrically insulated from the target using an adhesive Kapton film.

Figure 6:
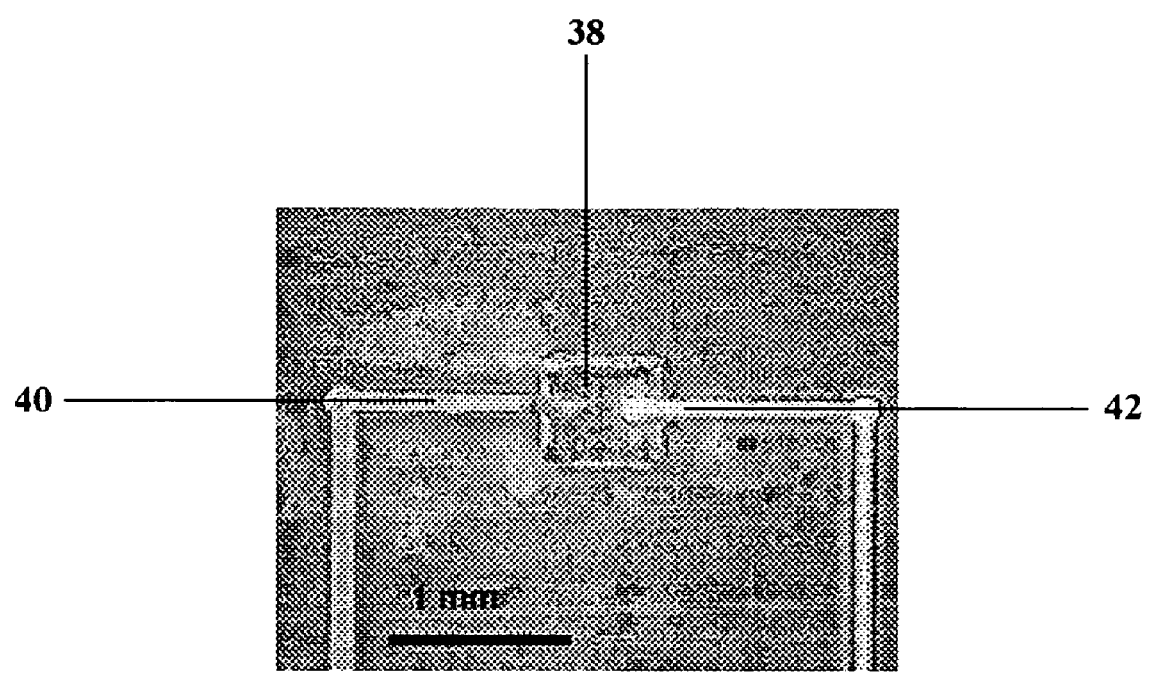
FIG. 6 is a micrograph of the intersection of a thermocouple junction and the lead wires.

Thin films of platinum (Pt) and platinum/rhodium (Pt/Rh) liquid precursors were deposited onto an insulating layer of polyimide. Laser decomposition was used to drive the films to the metal state. Sample cleaning and surface modification was used to clean the Kapton film, and to promote wetting and adhesion of the Pt and Pt/Rh precursors. Laser chemical processing achieved electrical properties near that of bulk Pt and Pt/Rh. Four-point probe measurements were used to qualitatively determine the degree of decomposition and porosity. In printing each device, the precursor for one arm was deposited and then laser decomposed. This procedure was then repeated for the remaining arm of the thermocouple. The intersections of the leads that connect the junction to contact pads are of particular interest. One lead must be written under the junction, and the other lead over the junction. As a result, these intersections are prone to cracking, and require optimized processing parameters. FIG. 6 shows a micrograph of the intersection of a thermocouple junction and the lead wires. The figure shows a smooth transition from Pt—Pt/Rh junction 38 to Pt lead 40, which was deposited first, and to Pt/Rh (arm) lead 42, which was deposited over junction 38. Deposition of metal layers with a thickness of more than a few hundred nanometers may also lead to unacceptable cracking of the decomposed metal film. In this example the deposit thickness is therefore held to approximately 0.2 to 0.5 microns. Metallization requiring greater thickness may be obtained by using an iterative method to deposit and decompose several layers.

Figure 7:
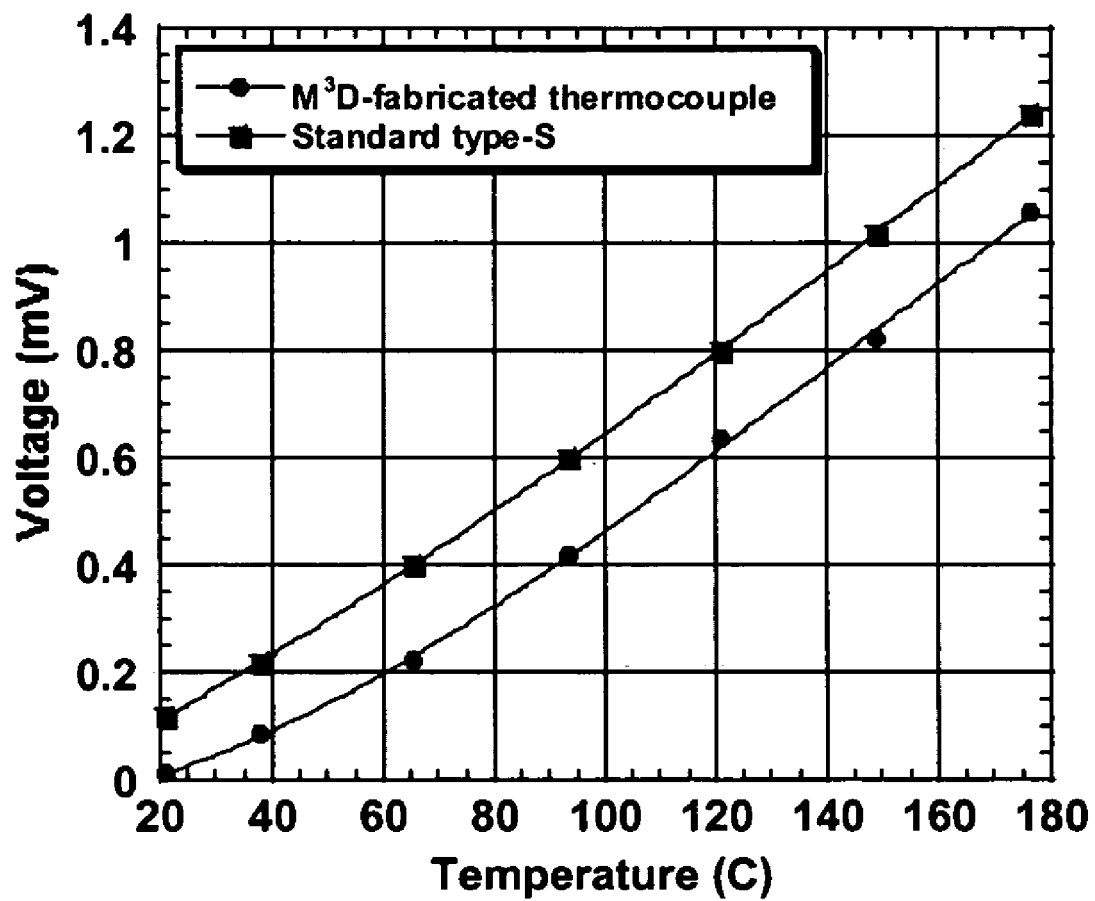
FIG. 7 shows a calibration curve for an M³D™ fabricated thermocouple.

The calibration curve for an M³D™-fabricated thermocouple is shown in FIG. 7. The corresponding curve for a standard type-S thermocouple with a reference temperature of 0° C. is also shown. Data was taken from 21° C. to 177° C. The device shows a characteristic curve that is very similar to the standard curve. The slope of the experimental curve is within less than 3% of the slope of the standard curve ($7.50 \times 10^{-3}$ mV/° C. versus $7.73 \times 10^{-3}$ mV/° C.) from 65 to 177° C. The difference in output may be due to the use of a reference temperature of approximately 21° C., rather than 0° C.

Example 10

Metallization of Low-Temperature Targets

Figure 8A:
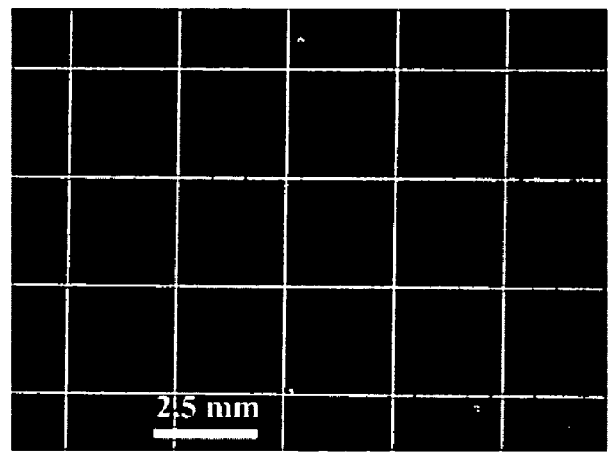
FIGS. 8a and 8b are micrographs of sintered silver lines on polycarbonate.
Figure 8B:
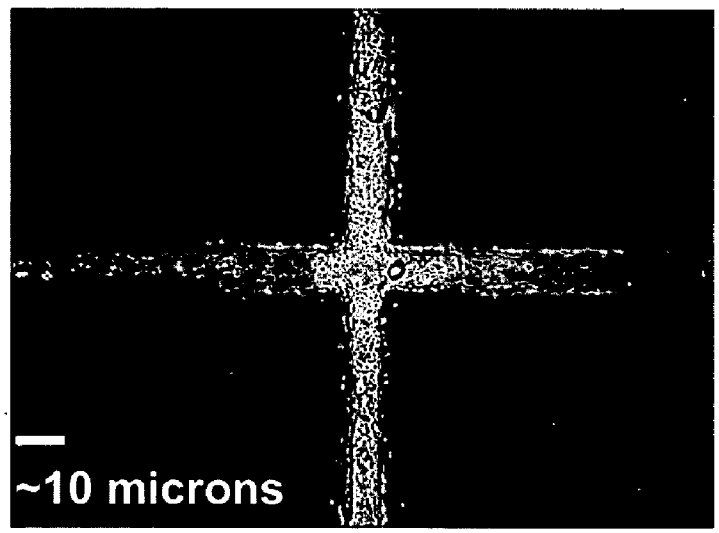

The invention may be used for metallization of plastic targets and UV curable polymers (bus lines, electrodes, interconnects, etc.), deposition of passive electronic components onto circuit board, deposition of embedded passives on circuit board, fabrication of vias between target layers, and metallization of epoxies. Indeed, the M³D™ process has been used to deposit and sinter silver on polycarbonate target material. Because of the high processing temperatures needed for decomposition of the silver precursors, an alternate approach to the precursor chemistry method was used to reduce the processing temperature required for direct write of metal lines on polycarbonate. This approach entails the use of a nanoparticle silver ink composed of nanometer-sized silver particles suspended in an aqueous solution. The median diameter of the particles was approximately 50 nanometers. The use of a nanoparticle formulation to print silver lines onto a low-temperature target can be extended to gold, and has the following advantages: the desired material (i.e., a highly conductive metal) already exists, eliminating the need for decomposition and removal of volatile organic solvents; the suspending medium can be aqueous, and will not chemically degrade polycarbonate; good adhesion on plastic has been demonstrated in a previous study; deposition and processing may be accomplished with the target held at room temperature; the nanoparticle ink can be deposited with linewidths below 10 microns; nanometer-size particles sinter at a laser power (<100 mW) that does not damage polycarbonate; and near bulk electrical properties are possible with laser sintering. Micrographs of sintered silver lines on polycarbonate are shown in FIGS. 8a and 8b. The resistivity of the lines is only about 3× the bulk resistivity of silver. In this example, the sintering temperature is approximately 180° C., which is significantly higher than the 120° C. damage threshold of polycarbonate.

Other possible applications include, but are not limited to, additive trimming of passive electronic components, and deposition of thick film pastes and semiconducting materials onto IC chips and plastics and other low-temperature targets.

Example 11

Pre-Processing of Deposition Materials

A treatable platinum deposition was prepared from water-soluble platinum tetrachloride. Droplets of platinum tetrachloride were preheated as they enter the deposition apparatus, and the temperature of the deposited material was raised to approximately 580 degrees Celsius via a substrate heater. A low-power diode laser then completed the decomposition of the platinum tetrachloride to pure platinum in the desired pattern. For electronics applications, preferred laser-treatable materials include but are not limited to: platinum tetrachloride, gold tetrachloride, copper formate, silver acetate, silver nitrate, barium titanate and aluminum oxide.

Example 12

Ultra-High Density Interconnects

The M³D™ process has been used to fabricate Ultra-High Density Interconnects (UHDI). At present, the minimum high-density interconnect linewidth attainable using conventional mask photolithographic techniques is approximately 50 microns, on a 50 to 75 micron pitch (spacing). The trend, however, in the HDI circuit industry has begun to demand low-cost, ultra-high density circuitry; i.e., linewidths from approximately 10 to 40 microns. Ink jetting has been used to deposit conductive lines onto plastic and other low-temperature targets using conductive polymer solutions. This method however yields lines with resistivities that are $10^4$ to $10^6$ times more resistive than metal lines deposited on plastics using the M³D™ technology. In addition, ink jetting is limited to linewidth of approximately 50 microns.

Contrastingly, the M³D™ process has been used to deposit high-density metal lines with a 25-micron linewidth on a 50-micron pitch. Twenty five micron wide precursor traces were deposited, and laser decomposition was used to define the final linewidth. The un-decomposed precursor was rinsed from the target; it may optionally be reclaimed. The process of deposition followed by laser decomposition has yielded linewidths from approximately 1 to 50 microns. As an example, 25-micron Pt interconnect lines with a 50-micron spacing were written onto 1-mil thick Kapton™ film using the M³D™ process. The targeted goal of 10-micron wide Pt lines with 10-micron spacing on polyimide is possible with optimized processing parameters.

Figure 9:
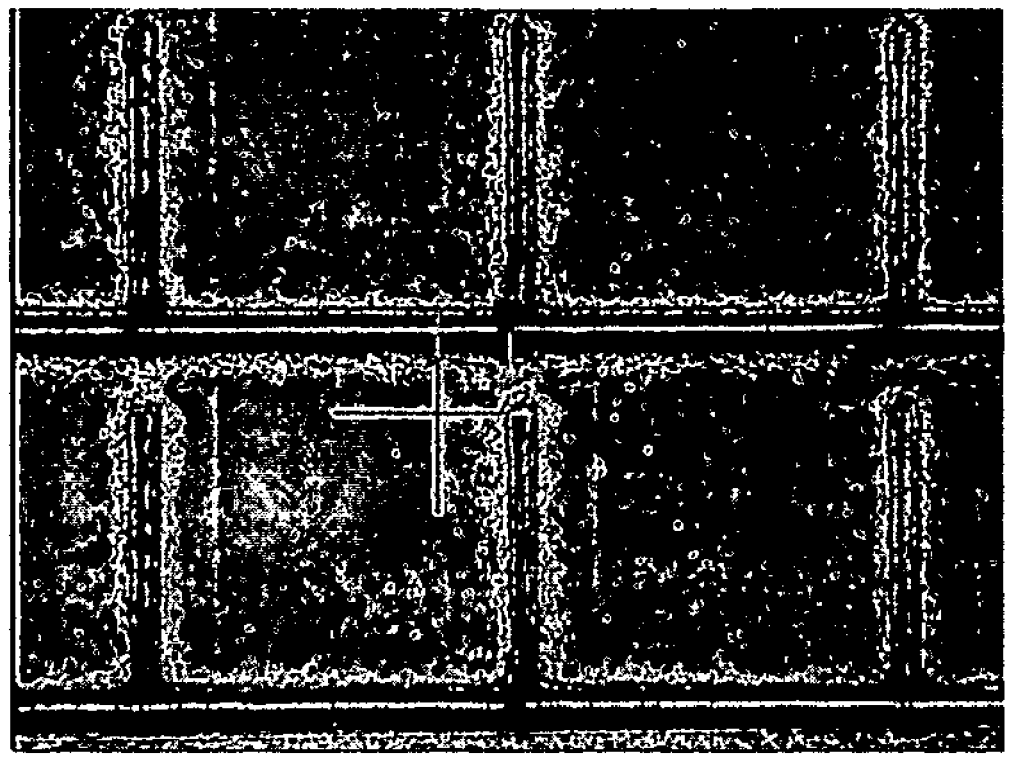
FIG. 9 is a micrograph of laser treated silver interconnects on a PMMA substrate.

The same linewidth and line density is possible using Ag. FIG. 9 shows silver interconnects deposited on PMMA for a polymer display application. It illustrates the capability of M3D to deposit and laser-fire conductive inks on low temperature polymer. The silver nanoparticle ink was deposited into 35 micron wide lines on the PMMA. The ink was then allowed to dry for 5 minutes at 80° C. After drying, a 50 mW, 532 nm CW laser was focused onto the deposits and scanned at 20 mm/s in order to sinter the nanoparticles. The measured resistance of 6 cm-long interconnects was 100 Ohms. This corresponds to a resistivity of 16 □Ohm-cm, which is less than approximately 10× larger than that of bulk silver. The deposits adhered well to the PMMA, passing an adhesive tape test.

Although the invention has been described in detail with particular reference to these preferred embodiments, other embodiments can achieve the same results. Variations and modifications of the present invention will be obvious to those skilled in the art and it is intended to cover all such modifications and equivalents. The various configurations that have been disclosed above are intended to educate the reader about preferred and alternative embodiments, and are not intended to constrain the limits of the invention or the scope of the claims. The entire disclosures of all patents and publications cited above are hereby incorporated by reference.

What is claimed is:

1. A method for depositing a material on a target, the method comprising the steps of:
    generating an aerosol stream of a material;
    propelling the aerosol stream to the target using an aerosol jet comprising an annular sheath gas, the annular sheath gas surrounding and focusing the aerosol stream; and processing a resulting deposit of the material with a laser at a processing temperature approximately at least as high as a damage threshold temperature of the target.

2. The method of claim 1 wherein a property of the deposited material is substantially similar to a property of the material in bulk form.

3. The method of claim 1 wherein the target is nonplanar.

4. The method of claim 1 wherein the damage threshold temperature is less than 200° C.

5. The method of claim 1 wherein the aerosol stream comprises one or more materials selected from the groups consisting of liquid molecular chemical precursors and colloidal or particle suspensions.

6. The method of claim 5 wherein the aerosol stream further comprises one or more materials generated from the groups consiting of a metallo-organic precursor; a colloidal metal solution; a metal paste; a metal nanoparticle suspension; a ceramic precursor; a ceramic paste; a resistor precursor solution; a resistor paste; an inorganic semiconductor suspension; a polymeric precursor solution; a colloidal suspension of metal, dielectric, or resistor particles; and any combination thereof.

7. The method of claim 1 wherein the aerosol stream comprises droplets or particles having a diameter of less than approximately 10 microns.

8. The method of claim 1 wherein the generating step comprises using ultrasonic transduction or pneumatic aerosolization.

9. The method of claim 1 wherein the aerosol jet comprises an inner aerosol-laden flow surrounded by a sheath gas flow that confines the inner aerosol-laden flow.

10. The method of claim 1 wherein the annular sheath gas focuses the aerosol stream to mesoscale dimensions.

11. The method of claim 10 wherein a deposited feature size of the deposit is as low as approximately four microns.

12. The method of claim 1 wherein the depositing step comprises providing relative motion of the target and the aerosol stream.

13. The method of claim 1 further comprising the step of pre-processing the aerosol stream prior to the depositing step.

14. The method of claim 13 wherein the pre-processing step comprises a process selected from the group consisting of humidifying the aerosol stream, drying the aerosol stream, cooling the aerosol stream, increasing the vapor content of a constituent of the aerosol stream, and increasing the vapor content of a second material that is not a constituent of the aerosol stream.

15. The method of claim 1 further comprising the step of post-processing the deposit prior to the processing step.

16. The method of claim 15 wherein the post-processing step comprises an action selected from the group consisting of thermal heating, reducing the ambient pressure, irradiating with electromagnetic radiation, and combinations thereof.

17. The method of claim 1 wherein the deposit comprises a width that is approximately equal to a diameter of a beam from the laser.

18. The method of claim 1 wherein a width of the deposit is greater than a diameter of a beam from the laser.

19. The method of claim 1 wherein the deposition step and the processing step are performed simultaneously.

20. The method of claim 1 wherein the processing step comprises at least one process selected from the group consisting of chemical decomposition, polymerization, sintering, and melting.

21. The method of claim 1 wherein the target comprises a material selected from the group consisting of polycarbonate, polyethylene terephthalate, polymethyl methacrylate, polytetrafluoroethylene, polyester, and epoxy.

22. The method of claim 1 wherein the laser comprises a diode laser.

23. The method of claim 1 wherein a power of the laser is approximately 10 milliwatts.

24. The method of claim 1 wherein the laser comprises a continuous wave mode or a pulsed wave mode.

25. The method of claim 1 wherein the processing step comprises delivering a laser beam to the target using either or both of a system of lenses and mirrors and an optical fiber.

26. The method of claim 1 wherein a beam from the laser is delivered to the target apart from the aerosol stream.

27. The method of claim 26 resulting in serial material deposition and laser processing.

28. The method of claim 1 wherein a feature size of the deposit after laser processing is as low as approximately one micron.

29. The method of claim 2 wherein the property is selected from the group consisting of electrical properties, physical properties, and optical properties.

30. The method of claim 29 wherein the property comprises resistivity.

* * * * *